United States Patent
Bartolf et al.

(10) Patent No.: US 10,516,022 B2
(45) Date of Patent: Dec. 24, 2019

(54) METHOD FOR MANUFACTURING A SEMICONDUCTOR DEVICE

(71) Applicant: ABB Schweiz AG, Baden (CH)

(72) Inventors: Holger Bartolf, Brugg (CH); Munaf Rahimo, Gänsbrunnen (CH); Lars Knoll, Wohlenschwil (CH); Andrei Mihaila, Baden (CH); Renato Minamisawa, Windisch (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/997,307

(22) Filed: Jun. 4, 2018

(65) Prior Publication Data

US 2018/0350943 A1    Dec. 6, 2018

Related U.S. Application Data

(63) Continuation of application No. PCT/EP2016/078426, filed on Nov. 22, 2016.

(30) Foreign Application Priority Data

Dec. 2, 2015 (EP) .................................. 15197559

(51) Int. Cl.
  *H01L 21/00* (2006.01)
  *H01L 29/417* (2006.01)
  (Continued)

(52) U.S. Cl.
  CPC .. *H01L 29/41708* (2013.01); *H01L 21/02238* (2013.01); *H01L 21/042* (2013.01);
  (Continued)

(58) Field of Classification Search
  None
  See application file for complete search history.

(56) References Cited

U.S. PATENT DOCUMENTS 7,074,643 B2   7/2006  Ryu
7,517,807 B1   4/2009  Tucker et al.
(Continued)

FOREIGN PATENT DOCUMENTS

JP    2010267762 A    11/2010

OTHER PUBLICATIONS

European Patent Office, International Search Report & Written Opinion issued in corresponding Application No. PCT/EP2016/078426, dated Feb. 3, 2017, 12 pp.

(Continued)

*Primary Examiner* — Reema Patel
(74) *Attorney, Agent, or Firm* — Taft Stettinius & Hollister LLP; J. Bruce Schelkopf

(57) ABSTRACT

A wide bandgap semiconductor device is comprising an (n−) doped drift layer between a first main side and a second main side. On the first main side, n doped source regions are arranged which are laterally surrounded by p doped channel layers having a channel layer depth. P+ doped well layers having a well layer depth, which is at least as large as the channel layer depth is arranged at the bottom of the source regions. A p++ doped plug extends from a depth, which is at least as deep as the source layer depth and less deep than the well layer depth, to a plug depth, which is as least as deep as the well layer depth, and having a higher doping concentration than the well layers, is arranged between the source regions and well layers. On the first main side, an ohmic contact contacts as a first main electrode the source regions, the well layers and the plug.

20 Claims, 10 Drawing Sheets

(51) Int. Cl.
  H01L 29/66    (2006.01)
  H01L 29/78    (2006.01)
  H01L 29/10    (2006.01)
  H01L 29/16    (2006.01)
  H01L 29/739   (2006.01)
  H01L 21/02    (2006.01)
  H01L 21/04    (2006.01)
  H01L 21/265   (2006.01)
  H01L 21/266   (2006.01)
  H01L 21/302   (2006.01)
  H01L 21/308   (2006.01)
  H01L 29/08    (2006.01)
  H01L 29/20    (2006.01)

(52) U.S. Cl.
  CPC ........ *H01L 21/0415* (2013.01); *H01L 21/266* (2013.01); *H01L 21/26513* (2013.01); *H01L 21/26546* (2013.01); *H01L 21/302* (2013.01); *H01L 21/3086* (2013.01); *H01L 29/0804* (2013.01); *H01L 29/0869* (2013.01); *H01L 29/1033* (2013.01); *H01L 29/1095* (2013.01); *H01L 29/1608* (2013.01); *H01L 29/41741* (2013.01); *H01L 29/41766* (2013.01); *H01L 29/6634* (2013.01); *H01L 29/66068* (2013.01); *H01L 29/66727* (2013.01); *H01L 29/7396* (2013.01); *H01L 29/7802* (2013.01); *H01L 29/2003* (2013.01)

(56) References Cited

U.S. PATENT DOCUMENTS

| | | |
|---|---|---|
| 2010/0200931 A1 | 8/2010 | Matocha et al. |
| 2012/0105670 A1 | 5/2012 | Arishima et al. |
| 2012/0153303 A1 | 6/2012 | Uchida |
| 2012/0205670 A1 | 8/2012 | Kudou et al. |

OTHER PUBLICATIONS

European Patent Office, Extended Search Report issued in corresponding Application No. 15197559.6, dated Apr. 29, 2016, 9 pp.

METHOD FOR MANUFACTURING A SEMICONDUCTOR DEVICE

TECHNICAL FIELD

The invention relates to the field of power electronics and more particularly to a method for manufacturing a semiconductor device.

BACKGROUND ART

In FIG. 21 a prior art MOSFET 100 is shown as known from U.S. Pat. No. 7,074,643 B2. The prior art MOSFET 100 is made of an n+ silicon carbide (SiC) substrate 80 and comprises between a first main side 20 and a second main side 22 an n− doped drift layer 2. On the first main side 20, two n++ doped source regions 3, 3' are arranged, each which is separated from the drift layer 2 in lateral direction (i.e. in a direction parallel to the first main side 20) by a p doped channel layer 4, 4' and on a side opposite to the first main side 20 by a p+ well layer 5, 5', which is higher doped than the channel layer 4, 4'. In between such two source regions 3, 3' surrounded by a channel layer 4, 4' and a well layer 5, 5', a p++ doped contact layer 65 is arranged, which laterally extends to the source regions. Due to its high doping concentration the p++ doped contact layer provides a good ohmic contact to a first main electrode 9 (source electrode). The contact layer 65 is a shallow layer spatially (i.e. in depth direction, which direction is vertical to the first main side 20) extending to a contact layer depth 67, which is less deep than the well layers 5, 5', but electrically and mechanically contacting the well layers 5, 5' in order to connect the well layers 5, 5' to the source electrode 9. The contact layer 65 overlaps with the source regions 3, 3' the channel layers 4, 4', so that the contact layer 65 is the only p doped layer in contact with the first main electrode 9.

A similar prior art device is known from US 2010/200931 A1, which document shows in a SiC MOSFET with a p well structure and a p+ plug. There is a triple point between the n source regions, well layer and plug, such that the plug does not overlap with the n source regions and again, the plug is the only p doped layer in contact with the first main electrode.

US 2012/205670 A1 discloses a SiC MISFET, which has a highly p doped plug arranged in a greater depth than the source regions, but embedded in the p channel layer. Again, the emitter electrode contacts only the source regions and the highly doped plug.

DISCLOSURE OF INVENTION

It is an object of the invention to provide a method for manufacturing a power semiconductor device having improved electrical properties comprising the following manufacturing steps:

(a) providing a wide bandgap substrate having a lowly doped layer of a first conductivity type forming a drift layer in the semiconductor device, the substrate having a first side and a second side opposite to the first side, wherein the lowly doped layer is arranged on the first side, (b) then creating on the first side a source region of the first conductivity type having higher doping concentration than the drift layer up to a source region depth, at least one channel layer of a second conductivity type, which is different from the first conductivity type, having a channel layer depth and surrounding the source region in a lateral direction, which direction is parallel to the first side, thereby separating the source region from the drift layer in the lateral direction, and a well layer of the second conductivity type having a well layer depth, which is at least as large as the channel layer depth, and having a higher doping concentration than the at least one channel layer, wherein the well layer separates the source region from the drift layer on a side of the well layer opposite to the first side, (c) after step (b) applying a continuous mask layer on the first side, then removing material through the continuous mask layer, thereby forming a plug mask having a plug mask opening in a central area of the well layer and source region to a depth, which is at least as deep as the source layer depth and less deep than the well layer depth, thereby splitting the source region into two source regions, applying a dopant of the second conductivity type on the first side such that creating a plug of the second conductivity type in the plug mask opening, the plug extending to a plug depth, which is at least as deep as the well layer depth, and having a higher doping concentration than the well layer, wherein by the creation of the plug splitting the well layer into two well layers, (d) after step (c) creating two gate electrodes on the first side, each of which is separated from any doped layer by an insulating layer, (e) after step (c) creating a first main electrode as an ohmic contact on the first side, which contacts the source regions, the well layers and the plug.

In step (b) first a first mask may be applied with an opening for the creation of a channel layer. Then a first dopant of the second conductivity type is applied for the creation of the channel layer up to the channel layer depth. Then a further layer is applied on the lateral sides of the first mask, by which further layer the openings are narrowed, thereby forming a second mask. Then a second dopant of the first conductivity type is applied for the creation of the source region up to the source region depth. Then a third dopant of the second conductivity type is applied for the creation of the at least one well layer up to the well layer depth.

In an alternative embodiment, in step (b) a third mask may be applied on the first side having openings for the creation of the source region, which third mask comprises a first mask layer and a second mask layer on top of the first mask layer, wherein the first mask layer has a higher etching selectivity than the second mask layer. Then a second dopant of the first conductivity type is applied for the creation of the source region up to the source region depth. The third mask may also be called source region mask. Then a third dopant of the second conductivity type is applied for the creation of the well layer up to the well layer depth. Afterwards, an etching step is performed on the first side, by which etching the first mask layer is farther removed at the openings than the second mask layer. Then the second mask layer is removed, wherein the remaining first mask layer forming a fourth mask. The fourth mask may also be called channel layer mask. Then a first dopant of the second conductivity type is applied for the creation of two channel layers up to the channel layer depth.

The advantage of such manufacturing methods is that two first sided layers, i.e. source region and the well layer, can be manufactured through the same mask. Furthermore, the source region and the well layer may be manufactured through a mask, which is self-aligned to the mask used for forming the channel layer or the other way around, i.e., the channel layer may be manufactured through a mask, which is self-aligned to the mask used for forming the source region and the well layer, so that all first sided layers are manufacturable through the same mask or self-aligned masks, leading to high accuracy of the positioning of these layers and simplifying the manufacturing method, because of redundantizing any special alignment procedure for aligning the first sided layers to each other. Together with the formation of self-aligned layers, the method allows to form the channel and well layer, both having the same conductivity type, in separate implantation/deposition steps, so that the doping concentrations of these layers of the same conductivity type can be optimized separately and giving more design freedom.

A MOS (metal-oxide-semiconductor) cell is formed by the regions beforehand The deep highly doped plug improves the contact to the well layer. Its depth is as least as great as the depth of the well layer to protect the channel layers of the MOS cell from peaks of the electric field, which are highest underneath the center of the MOS cell, i.e. below the location of the plug. This avoids undesired parasitic actions (parasitic transistor in case of a MOSFET and parasitic thyristor in case of an IGBT) as well as it diminishes short-channel effects (see FIG. 26). In this FIG. 26, it is shown that for a 300 nm wide channel (being the extension of the channel layer between the source region and the drift layer) the leakage current abruptly rises for forward blocking voltages smaller than the avalanche breakdown voltage, resulting in a premature breakdown of the device. For an inventive MOSFET with the same channel width, breakdown can be shifted to higher forward blocking voltages.

In addition the strength of the electric field in the gate-insulator gets reduced by the plug, wherein the effect is more pronounced for deeper plugs. The FIGS. 22 to 25 show the electric fields through different planes of the MOS-cell of the device. In FIGS. 22 to 25, the plug depth is given relative to the depth of the p well layer. "Prior Art" means that the plug is less deep than the p-well layer. "D1" means that the plug and the p-well layer have the same depth. "D2" shall mean that the plug depth is 1.5 times the well layer depth and "D3" means that the plug depth is two times larger than the well layer depth.

FIG. 22 shows the electric field from the first to the second main side between two MOS cells (cut along line A-A in FIG. 2). FIG. 23 is a detail from FIG. 22 at the interface between the first insulating layer 72 of the gate electrode 7 and the drift layer 2 (dotted area of FIG. 22). From this figure it is obvious, that the electric field is reduced in the wide bandgap material as well as in the insulating layer of the gate electrode (e.g. gate oxide). FIG. 24 shows the electric field in a plane parallel to the first main side (cut along line B-B in FIG. 2); showing the electric field in a non-depleted region 47 of the channel layer and in a depleted region 48 of the channel layer. FIG. 25 shows the electric field along line C-C in FIG. 2, which plane lies parallel to line A-A and goes through the channel layer. For all planes, a tremendous reduction of the electric field is obvious, this effect even being larger, because of the plug in the prior art devices having a plug depth, which is smaller as compared to the well layer depth.

Due to the high doping concentration of the plug a good ohmic contact is established to the first main electrode. As the plug is created in an area in which only the dopant of the lowly doped n− drift layer and the p+ dopant of the well layer is present, there is no need for overcompensation of the p++ dopant and the complete p++ dopant contributes to the effective doping (with the negligible need to overcompensate the n− drift layer doping).

Further preferred embodiments of the inventive subject matter are disclosed in the dependent claims.

BRIEF DESCRIPTION OF DRAWINGS

The subject matter of the invention will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and shall not confine the invention.

MODES FOR CARRYING OUT THE INVENTION

Figure 1:
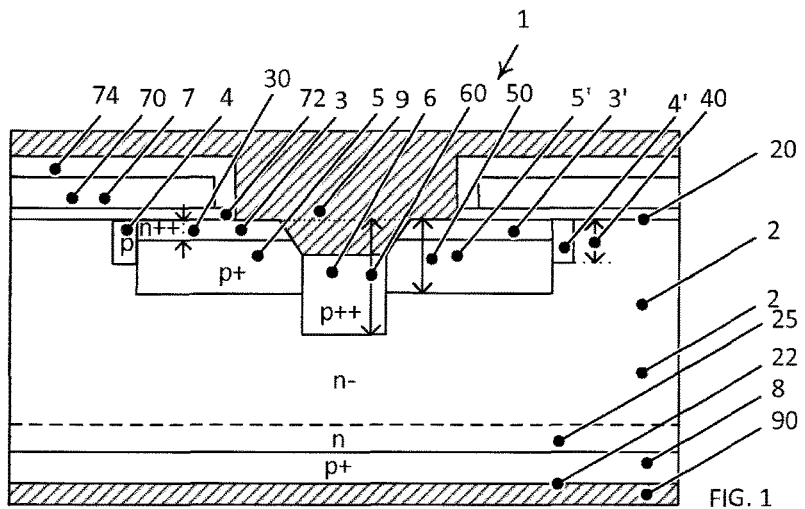
FIG. 1 shows an inventive IGBT.

FIG. 1 shows an inventive insulated gate bipolar transistor (IGBT) 1. The IGBT 1 is a wide bandgap device, e.g. a silicon carbide device, comprising a lowly (n−) doped drift layer 2 between a first main side 20 and a second main side 22 of the device opposite to the first main side 20. Wide band gap materials shall be materials having a bandgap of at least 2 eV like silicon carbide, gallium nitride or diamond not excluding other wide bandgap materials. Depending on the voltage class, the doping concentration and thickness of the drift layer 2 are chosen. Exemplarily, the drift layer 2 has a doping concentration between $1*10^{12}$ and $1*10^{17}$ cm$^{-3}$ and a thickness between 1 to 500 µm. The thicknesses shall be measured in depth direction, i.e. in a direction vertical to the first main side 20.

For an inventive IGBT, a p+ doped collector layer 8 is arranged on the second main side 22 and has exemplarily a doping concentration between $1*10^{18}$ and $1*10^{20}$ cm$^{-3}$. The collector layer 8 contacts a second main electrode 90, which is a collector electrode for an IGBT. Between the drift layer 2 and the collector layer 8, an n doped buffer layer 25 may be arranged, which has a higher doping concentration than the drift layer 2 (shown in FIG. 1 by a dashed line). The buffer layer may have an exemplary doping concentration between $1*10^{17}$ and $1*10^{19}$ cm$^{-3}$ and a thickness up to 3 µm.

Figure 2:
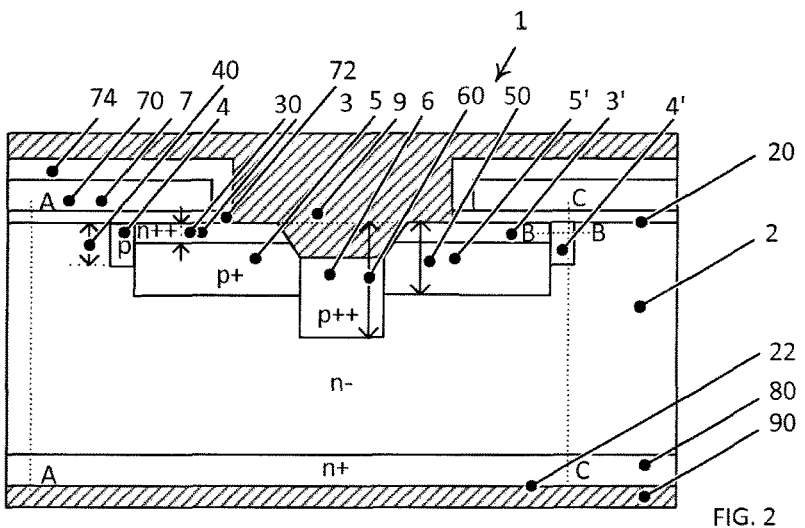
FIG. 2 shows an inventive MOSFET.

For an inventive MOSFET as shown in FIG. 2, on the second main side 22, an n+ doped drain layer 80 is arranged, which has exemplarily a doping concentration between $1*10^{18}$ and $1*10^{20}$ cm$^{-3}$. The drain layer 80 contacts a second main electrode 90, which is a drain electrode for a MOSFET.

In the following, the design on the first main side 20 is further explained for the example of an IGBT (FIG. 1), but is also applicable to a MOSFET (FIG. 2).

On the first main side 20 two n++ doped source regions 3, 3' having a source region depth 30 are arranged, which have a higher doping concentration than the drift layer 2. All depths shall be measured from the first main side 20, i.e. the depths shall be the maximum distance in depth direction, to which a layer/region extends. The first main side shall be such planar plane, which is the outermost plane in which substrate/semiconductor material is available on such side of the device at which the first main electrode is arranged. Exemplarily, the source region depth 30 measures up to 0.5 μm. The doping concentration may vary between $1*10^{18}$ and $1*10^{21}$ cm$^{-3}$ or between $1*10^{19}$ and $1*10^{21}$ cm$^{-3}$. Exemplarily, the source regions 3, 3' belonging to one MOS cell have a lateral distance from each other of up to 7 μm.

On both outer lateral sides of the source regions 3, 3' (on the outer lateral sides of the n++ source regions not facing each other, i.e. which do not form a common opening in between, and which lie below a gate electrode 7) p doped channel layers 4, 4' are arranged. Thus, the p channel layers 4, 4' surround the n source regions 3, 3' on the outer lateral sides, i.e. on a side of the n source regions 3, 3' parallel to the first main side 20 and below the gate electrodes 7. Exemplarily, the channel layers 4, 4' have a channel layer depth 40, which is larger than the source region depth 30. Each source region 3, 3' is separated from the drift layer 2 in lateral direction by a channel layer 4, 4' in a direction parallel to the first main side 20. The channel layer 4, 4' may have a doping concentration between $1*10^{16}$ and $1*10^{18}$ cm$^{-3}$.

P+ doped well layers 5, 5' which have a higher doping concentration than the channel layers 4, 4', separate the two source regions 3, 3' from the drift layer 2 on a side of the well layer opposite to the first main side 20.

Exemplarily, the doping concentration of the well layers 5, 5' may be at least 10 times higher than the doping concentration of the channel layers 4, 4' or the doping concentration of the well layers 5, 5' may be between 10 times and 100 times higher than the doping concentration of the channel layers 4, 4'. The well layers 5, 5' may have a doping concentration between $1*10^{17}$ and $1*10^{21}$ cm$^{-3}$ or $1*10^{18}$ and $1*10^{20}$ cm$^{-3}$.

The well layers 5, 5' have a well layer depth 50, which is at least as large as the channel layer depth 40. Thus, the well layers 5, 5' may extend to the same depth as the channel layers 4, 4' or they may be deeper than the channel layers 4, 4'. The depth of the well layers 5, 5' and/or the channel layers 4, 4' may exemplarily be up to 3 μm.

In the channel layers 4, 4', a MOS channel may be formed from the source regions 3, 3' to drift layer 2. The channel extends in the substrate product 10 from the source region 3, 3' close to the surface to the drift layer 2. Thus, the doping concentration of the channel layers 4, 4', which has to be lower than the doping concentration of the well layers 5, 5', is the doping concentration from the first main side 20 at maximum up to the depth of the source regions 3, 3', i.e. up to a depth, in which the channel is formable.

Between the two source regions 3, 3', a p++ doped plug 6 is arranged, which has a higher doping concentration than the well layers 5, 5'. In an exemplary embodiment, the doping concentration of the plug 6 is at least 10 times higher than the doping concentration of the well layer 5, 5'. In another exemplary embodiment, the doping concentration of the plug 6 is between 10 times and 100 times higher than the doping concentration of the well layer 5, 5'. The plug 6 may have a doping concentration between $2*10^{17}$ and $2*10^{21}$ cm$^{-3}$ or between $1*10^{19}$ and $2*10^{21}$ cm$^{-3}$.

The plug 6 extends from a depth, which is at least as deep as the source layer depth 30 to a plug depth 60, which is as least as deep as the well layer depth 50, exemplarily deeper than the well layer depth 50. Between the plug 6 and the two source regions 3, 3', the well layers 5, 5' extend on the first main side 20 to the surface of the substrate product 10 and contact the first main electrode 9. Thus, the well layers 5, 5' separate the plug 6 from the source regions 3, 3'. As the plug 6 is completely arranged in a deeper plane (plane parallel to the first main side 20) than the source regions 3, 3', the source regions 3, 3' are always separated from the plug 6 by the well layers 5, 5'. By such an arrangement, it is ensured that the source regions 3, 3' do not overlap with the plug 6. As the intrinsic doping level of a wide bandgap semiconductor material is negligible as compared to a low-band gap semiconductor material (e.g. Silicon) and as the doping concentrations of the plug 6 and source regions 3, 3' are within the same order of magnitude, by an overlap of the n and p doped layers a region could be created, in which no dopant is electronically active, i.e. such a region would be insulating. Such an effect is avoided by the inventive structure.

The source regions 3, 3' are separated from the drift layer 2 by the well layers 5, 5' and the channel layers 4, 4'.

Figure 11:
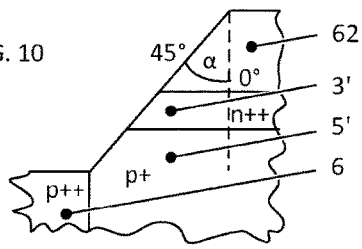
FIG. 11 shows a detail from the dashed circle in FIG. 10.

The plug 6 is arranged in a recess from the first main side 20, which recess exemplarily has an opening angle α between 0° and 60°. As shown in FIG. 11, an opening angle α of 0° shall be an angle of 90° to the first main side 20. An opening angle α of up to 45° shall be an angle, which leads to an opening with decreasing diameter with increasing depth of the recess. Such an opening angle α leads to a larger contact of the source regions 3, 3' and the well layers 5, 5' and may improve the implantation of the dopant for the creation of the plug as dopants, which are applied at other angles than vertical to the first main side 20 may also contribute to the implantation. Additionally, the contact area of the source region 3, 3' to the first main electrode 8 can be improved by creating the gate electrodes 7 backspaced from the width of the plug 6, i.e. the two gate electrodes 7, between which a contact to the first main electrode 9 is established, have a distance from each other which is greater than the width of the plug 6 so that the first main electrode 9 contacts the source regions 3, 3' on the lateral, inclined sides and from top.

The opening angle α may be a constant angle (i.e. the recess having straight sidewalls) or the angle may vary, exemplarily defining curved (u-formed) sidewalls or by multiple-angled sidewalls.

On the first main side 20, two gate electrodes 7 are arranged, each of which comprises a first insulating layer 72, a second insulating layer 74 and a gate layer 70, which is separated from any doped layer by the first insulating layer 72. The source regions 3, 3', the channel layers 4, 4' and the drift layer 2 extend to the gate electrode, i.e. to the first insulating layer 72. The gate electrode 7 is formed as a planar gate electrode (as shown in FIGS. 1 and 2), wherein the gate electrode 7 is arranged on top of the source regions 3, 3', the channel layers 4, 4' and the drift layer 2 such that a MOS channel may be generated in the channel layer 4, 4' below the gate electrode 7 between the source regions 3, 3' and the drift layer 2 by inversion of the channel layer p by the application of a gate-voltage larger than the threshold-voltage of the MOS interface.

In case of the first insulating layer 72 being an oxide layer and the gate layer 70 being a metal, the inversion-channel is called a MOS channel (metal-oxide/insulator-semiconductor), whereas otherwise (insulating layers 72, 74 being made of any insulating materials; e.g. dielectrics such as high-k materials or Silicate glasses such as PSG or BPSG not excluding other insulators) the channel may also be called MIS channel (metal-insulator-semiconductor). As a material for the gate layer 70 any appropriate electrically conductive material like a metal or doped polycrystalline silicon may be used. The term MOS device/MOSFET shall also cover such MIS devices/MISFETs and applies also for IGBTs which are MOS/MIS-controlled.

A first main electrode 9 is formed as an ohmic contact on the first main side 20, which contacts the two source regions 3, 3' and the plug 6, and the two well layers 5, 5'. For an IGBT 1 as shown in FIG. 1 the first main electrode 9 functions as an emitter electrode, for a MOSFET as shown in FIG. 2, the first main electrode 9 functions as a source electrode. The first main electrode 9 may be formed by first forming a metallic layer in the opening between two gate electrodes 7 to create an ohmic contact to the plug 6, the well layers 5, 5' and the source regions 3, 3'. On top of the metallic layer forming the ohmic contact, another metallic layer is then generated, which contacts the first metallic layer. Additionally the second metallic layer also covers the area on top of the gate electrode 7, i.e. it covers the second insulating layer 74 and is thereby insulated from the gate layer 70.

The structure disclosed beforehand forms a MOS cell to control an IGBT and/or MOSFET. The MOS cell is formed between one first main electrode contact opening and the second electrode 90, i.e. the MOS comprises the plug 6, the well layers 4, 4' on both sides of the plug 6, the source regions 3, 3', the channel layers 4, 4', the drift layer 2 and the collector layer 8 or the drain layer 80.

The cells, i.e. the regions in the cell may be designed to form of regular patterns like stripes, hexagonal, triangular or square design. In a power semiconductor device, one or more of such MOS cells may be arranged. Such MOS cells may be interconnected to each other.

The devices may be designed as vertical devices as shown in the FIGS. 1 and 2, but it is also possible to have them designed as lateral devices, in which source and drain (MOSFET) or emitter and collector (IGBT) are arranged on the same side of the device. For an inventive IGBT, the inventive deep plug 6 is applicable for all different kinds of IGBTs such as reverse conducting IGBTs having alternatingly p+ collector regions and n+ short regions arranged on the second main side 22, exemplarily also as a Bi-mode Insulated Gate Transistor (BIGT) additionally having a large pilot p+ collector region in the central part of the device on the second main side 22 surrounded by alternating smaller p+ and n+ short regions. The pilot and short regions may be connected. Such BIGTs are disclosed in U.S. Pat. No. 8,212,283 B2.

The inventive IGBT may be designed as a non punch-through IGBT or as a punch-through/soft-punch-through IGBT having a buffer layer 25 arranged between the n− doped drift layer 2 and the p+ doped collector layer 8. In case of the non-punch through design the E-field is triangular in shape up to avalanche breakdown. In the other cases the E-field penetrates through the interface between drift layer 2 and buffer layer 25 where it gets stopped due to the high doping concentration of the buffer layer.

Super-Junction designs are possible for all kind of inventive devices. An exemplary technological approach for superjunctions is based on either trench-etching followed by epitaxial-refill or sequential epitaxial growth followed by multiple implantation, not excluding other techniques.

For manufacturing an inventive wide bandgap semiconductor device, the following manufacturing steps are performed. In a step (a) a wide bandgap substrate product 10 having a lowly doped layer of a first conductivity type forming a drift layer 2 in the semiconductor device is provided. The substrate product 10 has a first side 12 and a second side 14 opposite to the first side 12, wherein the lowly doped layer is arranged on the first side 12. On the second side 14, the substrate product 10 comprises in the case of a vertical IGBT a p+ doped substrate, which or part of which forms the collector layer 8 in the finalized IGBT device. The layer 8 may be thinned down at the end of the manufacturing process.

In a step (b) on the first side 12 an n doped source region 3, 3' having higher doping concentration than the drift layer 2 is created up to a source region depth 30. At least one p doped channel layer 4, 4' having a channel layer depth 40 is created. The source region 3, 3' is separated from the drift layer 2 by a channel layer 4, 4' in a direction perpendicular to the first side 12. The channel layer depth 40 is larger than the source region depth 30. A p+ doped well layer 5, 5' having a well layer depth 50, which is at least as large as the channel layer depth 40, and having a higher doping concentration than the at least one channel layer 4, 4' is created. The well layer 5, 5' separates the source region 3 from the drift layer 2 on a side of the well layer opposite to the first side 12.

In a step (c) and after step (b) a p++ doped plug 6 is created having a plug depth 60, which is larger than the well layer depth 50. For the creation of the plug 6, a continuous mask layer is applied on the first side 12 and then material is removed from the continuous mask layer and the underlying layers, i.e. the source region 3 and the well layer 5, thereby forming a plug mask 62 having a plug mask opening (FIG. 11, which is a detail from the dashed circle in FIG. 10). The plug mask is created in the central area of the well layer 5 and source region 3 to a depth, which is at least as deep as the source layer depth 30 (or deeper than the source layer depth 30) and less deep than the well layer depth 50 (i.e. the plug mask 62 does not extend to the drift layer 2), thereby splitting the source region 3 into two source regions 3, 3'. "Central area" shall mean that the plug mask opening is created in a central area of the source region 3 and well layer 5, such that after having created the plug mask opening, the source region 3 and well layer 5 are present on two opposite sides of the opening (i.e. source region 3 and 3' and well layer 5 and 5').

By the plug mask opening being at least as deep as the source region depth 30, it is ensured that the plug 6 is created in and area, in which no n++ dopant from the source regions 3, 3' is present, i.e. the plug 6 is no overcompensated region. The plug 6 is created in an area in which only the p+ dopant from the well layer 5 is present, and if the plug extends to a greater depth than the well layer 5, also the n− dopant from the drift layer 2, which is easily overcompensated due to the drift layer 2 being lowly n doped and the plug 6 being highly p doped.

A p dopant is applied on the first side 12, exemplarily by implantation or by deposition, such that a p++ doped plug 6 is created in the plug mask opening.

The plug is arranged between the two source regions 3, 3'. The doping concentration of the plug 6 is larger than that of the well layers 5, 5'. The doping concentration of the plug may be at least 10 times higher than the doping concentration of the well layers 5, 5'. In another exemplary embodiment, the plug 6 may be created with a doping concentration, which is between 10 times and 100 times higher than the doping concentration of the well layer 5. The plug 6 may be created with a doping concentration between $2*10^{17}$ and $2*10^{21}$ cm$^{-3}$ or between $1*10^{19}$ and $2*10^{21}$ cm$^{-3}$. The plug may have a width of at maximum 5 μm or at maximum 3 μm.

In a step (d) after step (c) gate electrodes 7 are created on the first side 12. Each gate electrode 7 comprises an electrically conductive gate layer 70, which is separated from any doped layer by an insulating layer in form of a thin first insulating layer 72. Exemplarily, a second insulating layer 74, which is thicker than the first insulating layer 72, is formed on top of the gate layer 70.

In a step (e) after step (c) a first main electrode 9 is created as an ohmic contact on the first side 12, which contacts the two source regions 3, 3', the two well layers 5, 5' and the plug 6.

Figure 3:
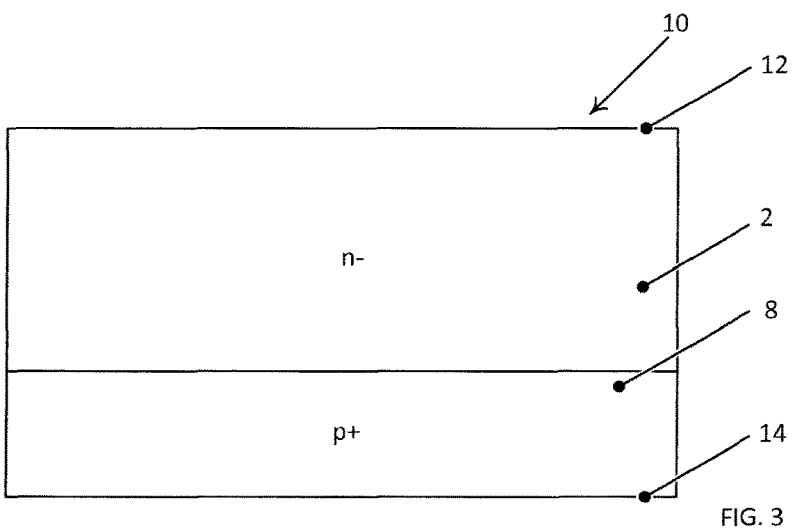
FIGS. 3 and 5 to 10, 12 and 16 to 17 show steps for an inventive method for manufacturing a wide bandgap semiconductor device (IGBT/MOSFET)

In the FIGS. 3 and 6 to 12 and 16 a method for manufacturing a wide bandgap non punch-through power IGBT is shown. In FIG. 3 the substrate product of step (a) is shown. The substrate product 10 comprises a lowly doped layer forming the drift layer 2 in the device. On the second side 14, the substrate product 10 comprises a higher p+ doped layer forming the collector layer 8. Exemplarily the substrate product 10 is made by providing a p+ doped substrate, which forms a collector layer 8 in the finalized IGBT, on which a lowly (n–) doped layer as a drift layer 2 is created, exemplarily by epitaxial growth. The layer 8 may be thinned down at the end of the manufacturing process.

Figure 4:
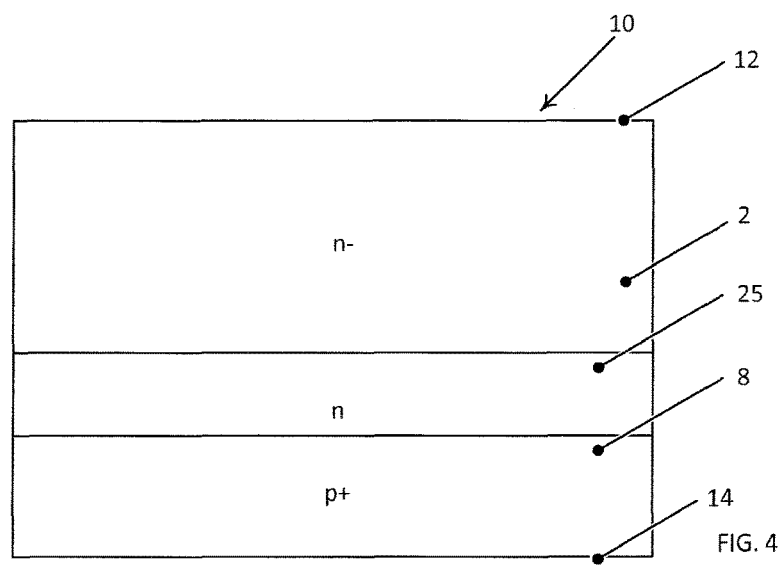
FIG. 4 shows an alternative manufacturing step (a)

Alternatively, as shown in FIG. 4, for a punch-through IGBT, in which a buffer layer 25 is arranged between the drift layer 2 and the collector layer 8, a p+ doped substrate may be provided. On the p+ doped substrate, first an n doped buffer layer 25 and then an n– doped drift layer 2 is created, exemplarily by epitaxial growth. The layer 8 may be thinned down at the end of the manufacturing process.

By such an epitaxial growth, exemplarily a layer of constant doping concentration is created, but of course also a variation of doping concentration is possible, e.g. a decreasing doping concentration in direction from the first side 12 to the second side 14. The values for the doping concentration given above shall be understood as the mean doping concentration in case of constant doping concentration (not excluding variation of doping concentration due to imperfection of the manufacturing method) or as a maximum doping concentration in case of varying doping concentration. The same shall apply for implanted profiles which are defined by multiple cascades with different energies and doses and may form any kind of graded profile by the superposition of several Gaussian profiles, for each cascade one Gaussian profile.

Figure 5:
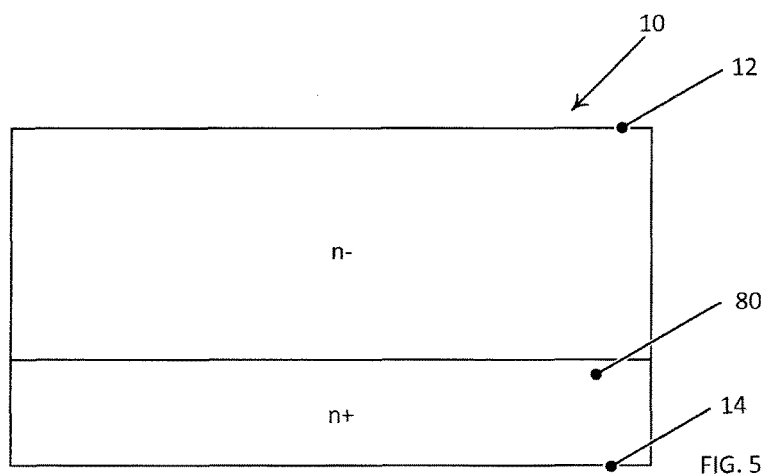

For the creation of an inventive MOSFET, a substrate product 10 may be provided (FIG. 5) which is made by providing an n+ doped substrate, which or part of which forms the drain layer 80 in the finalized MOSFET device. On the n+ doped substrate, a drift layer 2 may be created, e.g. by epitaxial growth. The layer 80 may be thinned down at the end of the manufacturing process.

Figure 6:
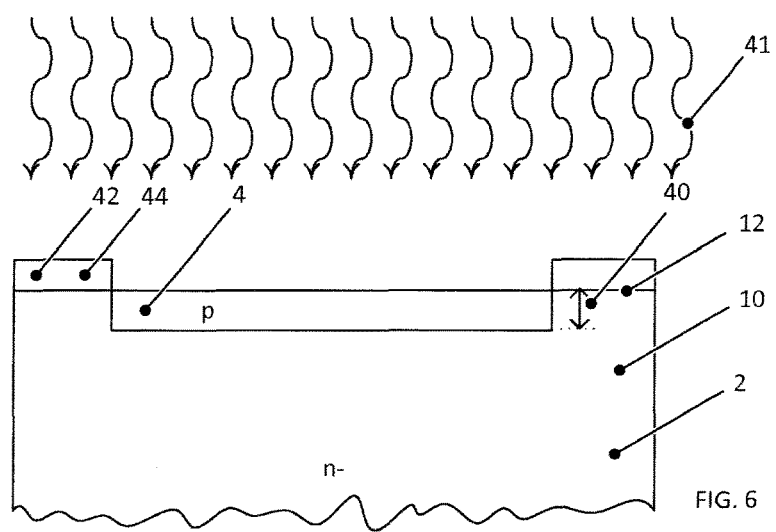
Figure 7:
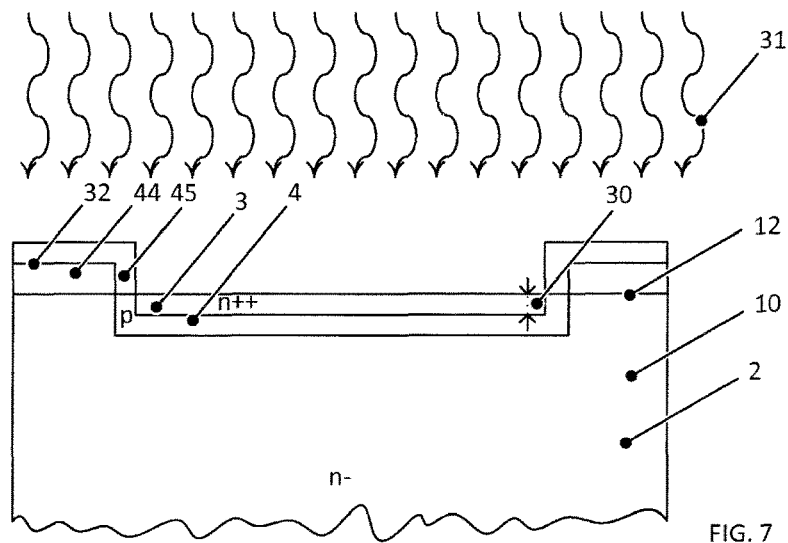

In an exemplary embodiment, in step (b) first a first mask 42 having a polycrystalline silicon layer 44 with an opening for the creation of a channel layer 4, is applied as shown in FIG. 6. Exemplarily, for the creation of the first mask 42, first a continuous stack of layers comprising a thin oxide (SiO$_2$), polycrystalline silicon and oxide layer is formed, which is then etched down to form the first mask 42 having an opening for the channel layer 4. Exemplarily, the opening has a width of up to 20 μm (width shall be the largest diameter of a circle that may be laid into a region/opening in a plane parallel to the first side 12). The total mask stack shall have such a thickness that a dopant is hindered from penetration into the substrate product 10 in such areas, which are covered by the mask. The dopants shall penetrate into the substrate product 10 at the positions of the mask openings.

Then a first dopant 41 (p dopant) is applied on the first side of the substrate, e.g. by implantation or deposition for the creation of the channel layer 4. If the dopant is implanted, the dopant is applied on the first side and into the substrate, if the dopant is deposited, the dopant is applied on the first side and onto the substrate.

In an exemplary embodiment, aluminum or boron is applied as first dopant 41. This process may be performed at an elevated temperature, exemplarily at a temperature up to 700° C. All dopants 31, 41, 51, 61 are applied at any appropriate angle to the first main side 20. They may be applied perpendicular to the first main side 20, but if desired any other incident angle may be used.

For the implantation (deposition) a dose between $1*10^{11}$ and $1*10^{16}$ cm$^{-2}$ and/or an energy between 1 keV and 1 MeV may be applied. Thus, a channel layer 4 may be created having a doping concentration between $1*10^{16}$ and $1*10^{18}$ cm$^{-3}$. The first dopant 41 may be applied into a channel layer depth 40 of at maximum 2 μm.

Then another oxide layer is generated as further layer (e.g. by oxidizing the polycrystalline silicon layer to form another oxide layer), which covers the remaining polycrystalline silicon layer 44 to the top and lateral sides, so that the opening is narrowed (FIG. 7), thereby forming a second mask 32, which is self-aligned to the first mask 42. The exemplarily described process may be called self-aligned process by oxidation of polycrystalline silicon. Again, the total mask stack shall have such a thickness that a dopant is hindered from penetration into the substrate product 10 in such areas, which are covered by the mask.

Then a second n dopant 31 is applied (implanted/deposited) for the creation of the source region 3. This source region 3 is shallower, but higher doped than the channel layer 4, so that the channel layer 4 separate the source region 3 from the drift layer 2. The second dopant 31 is applied with a dose of exemplarily between $1*10^{13}$ and $1*10^{16}$ cm$^{-2}$ and/or an energy between 1 keV and 500 keV up to a source region depth 30 of exemplarily at maximum 0.5 μm.

Figure 14:
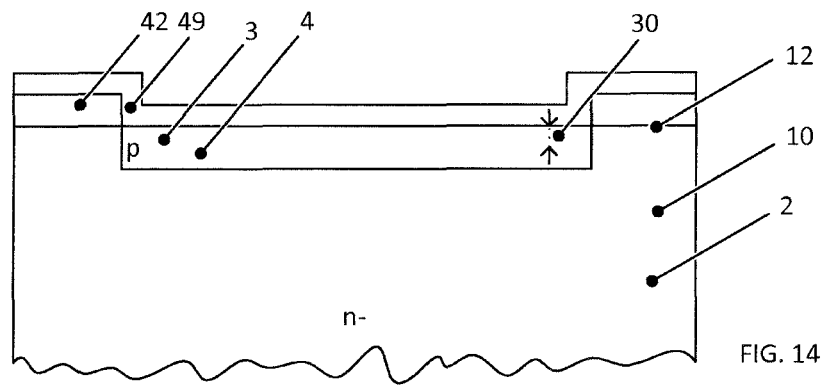
FIGS. 14, 15 show manufacturing steps of an alternative manufacturing method (step (b))
Figure 15:
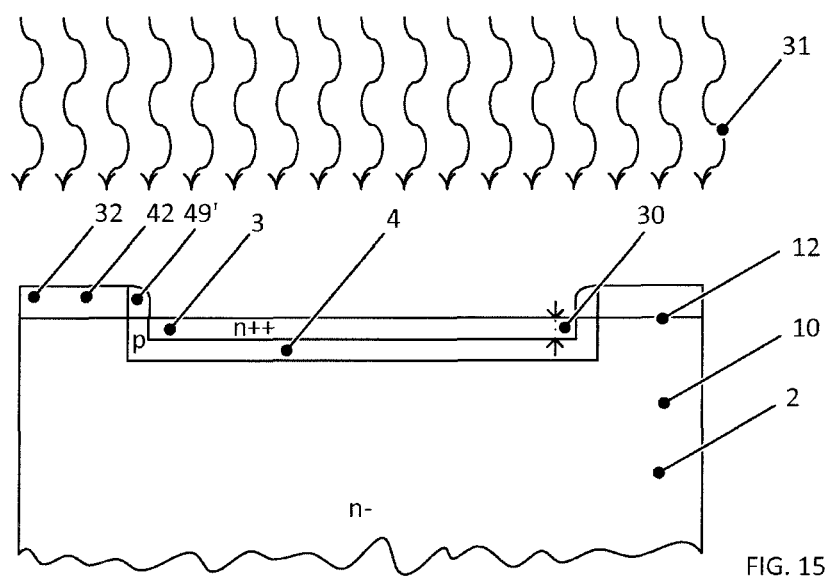
Figure 16:
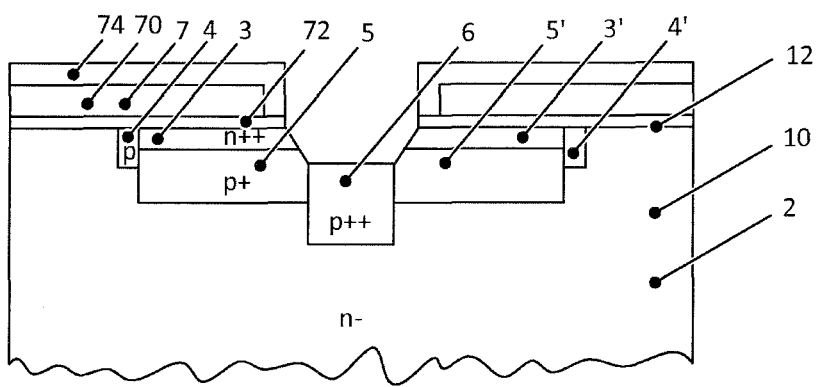

In an alternative method, for the creation of the first mask 42, a continuous stack of layers as described beforehand (i.e. base mask layer, which may be an oxide layer, a polycrystalline silicon layer and a covering mask layer, which may be an oxide layer). Again, these layers are etched to form openings and a first dopant 41 is applied (FIG. 6). Then a top mask layer 49 is applied as a continuous layer, exemplarily by deposition, which is made of a different material than the covering mask layer of the first mask 42, exemplary silicon nitride or polycrystalline silicon (FIG. 14) in the case of the covering mask layer being an oxide layer. Afterwards, an etch step (exemplarily a dry etch) is performed without a protection mask. By this step the top mask layer 49 is removed on top of the first mask 42 and in the first mask openings, i.e. at the interface to the substrate product 10 (FIG. 15), which is a bottom side of the opening. The top mask layer 49 material, however, remains at the lateral sides of the opening, such, that the second mask 32 has a narrower opening than the first mask 42. The etch process stops at the covering mask layer of the first mask 42. However, the top mask layer material or at least part of the top mask layer material remains on the lateral sides of the openings (thereby forming a remaining top mask layer 49'), such that the first mask 42 and the remaining top mask layer 49' form a second mask 32. The etch step is performed in a directional manner such that the top mask layer is sensitive to the etching (i.e. the top mask layer is removed on the top of the first mask 42 and at the bottom of the first mask openings) but such that it remains on the sidewalls of the first mask 42, and that the covering mask layer acts as an etch stop. This means, that a so-called "spacer" is generated by the top mask layer (e.g. SiN, polycrystalline silicon or SiO2) in an analogously self-aligned manner as in the aforementioned case of thermal oxidation of polycrystalline silicon. This technological approach may be called self-aligned process by spacers.

Figure 8:
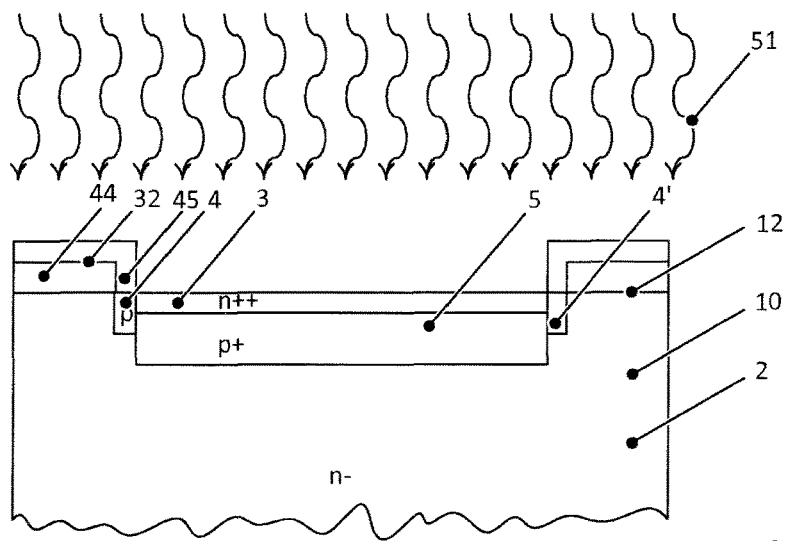

After having performed either of the aforementioned processes (self-aligned process by oxidation of polycrystalline silicon or self-aligned process by spacers), a third dopant 51 (p dopant) is applied (implanted/deposited) for the creation of the well layer 5 up to the well layer depth 50 (FIG. 8). The third dopant 51, e.g. aluminum or boron, is applied with a dose between $1*10^{11}$ and $1*10^{16}$ cm$^{-2}$ and/or an energy between 1 keV and 1 MeV up to a well layer depth 50 of exemplarily at maximum 2 μm. The well layer 5 is created to have a doping concentration, which is at least 10 times higher than the doping concentration of the channel layers 4, 4' or, exemplarily to have a doping concentration which is between 10 times and 100 times higher than the doping concentration of the channel layers 4, 4'. The doping concentration of the well layer 5 may be between $1*10^{18}$ and $1*10^{20}$ cm$^{-3}$ or between $1*10^{17}$ and $1*10^{21}$ cm$^{-3}$.

The well layer 5, 5' may also be formed with a retrograde profile, which means that a maximum doping concentration of the well layer 5 is arranged close to the p/n junction to the drift layer 2, whereas the local doping concentration decreases towards the first main side 20. The doping concentrations of the layers/regions shall be understood as the maximum doping concentrations of the layers/regions if not stated otherwise.

Again, the implantation/deposition may be performed at a temperature higher than room temperature, exemplarily at a temperature up to 700° C. The well layer depth 50 is at least as large as the channel layer depth 40. It shall be ensured that the well layer doesn't deplete during blocking conditions, thereby preventing a short between the first and second main electrode.

The source region 3 is an overcompensated layers, which means that in this layer also a dopant of the other conductivity type is present, e.g. in the source region 3 also the first dopant 41 for the channel layer 4 and the third dopant 51 for the well layer 5 are applied, but as the second n dopant 31 dominates, this layer is n-type (higher n-doping concentration).

Figure 9:
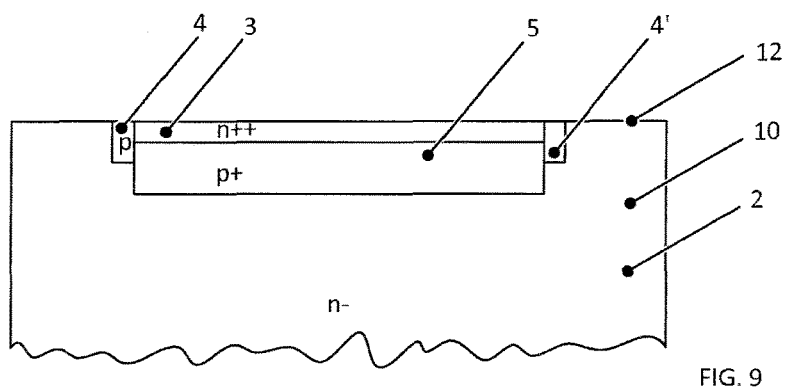
Figure 10:
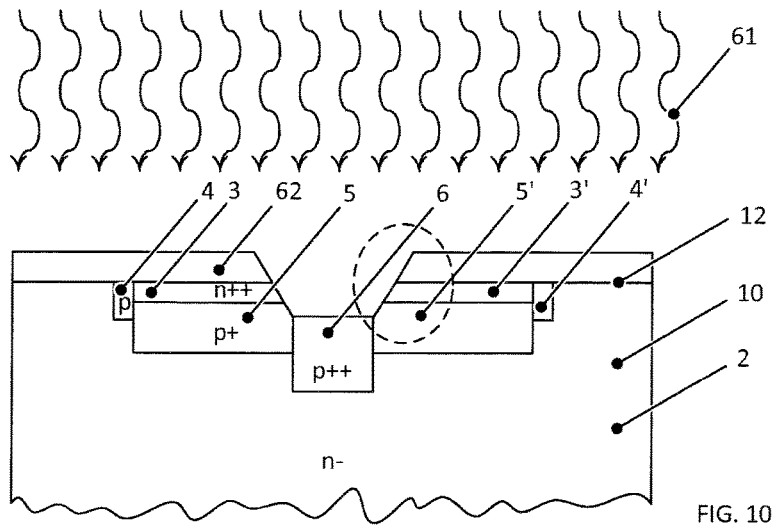

As shown in FIG. 9, the second mask 32 is then removed after having created the source region 3, channel layer 4 and well layer 5. A new continuous mask material layer which can be made from oxide is applied and etched to have an opening in the central region of the source region 3 and well layer 5, thereby forming a plug mask 62. The plug mask extends through the plug mask 62, the source region 3 to a region within the well layer 5 or at least to the interface between the source region 3 and the well layer 5, thereby splitting the source region into two source regions 3, 3' and the well layer 5 into two well layers 5, 5'. A fourth dopant 61 (p dopant, e.g. Al or B) may be applied, e.g. with a dose between $1*10^{11}$ and $1*10^{16}$ cm$^{-2}$ and/or an energy between 1 keV and 1 MeV up to a plug depth 60, which is at least as great as or greater than the well layer depth 50. Exemplarily, the plug depth 60 is 1.05 to 1.5 times (i.e. 5 to 50%) or up to two or even up to four times larger than the well layer depth 50 (FIG. 10). An activation anneal step at a high temperature, e.g. between 1500° C. to 1900° C. may follow. Afterwards, a sacrificial oxidation step may be performed. When implanting the p dopant for the plug in an opening of more than 0°, p dopant may be introduced into the source regions 3, 3'. In order to reduce or eliminate such undesired p doping, which leads to a reduction of the effective n doping, the p dopant in the source regions 3, 3' can be reduced or eliminated by the sacrificial oxidation.

Due to the introduction of the plug 6, the source region 3 and the well layer 5 is split into two source regions 3, 3' and two well layers 5, 5'.

The opening above the plug 6 (i.e. formed by the well layers 5, 5', source regions 3, 3' and the plug mask 62) exemplarily has an opening angle α between 0° and 60° or between 0° and 45°. As shown in FIG. 11, an opening angle α of 0° shall be an angle of 90° to the first main side 20. An opening angle α of up to 60° shall be an angle, which leads to an opening with decreasing diameter for greater depths. Such a wider opening angle α may improve the implantation of the dopant for the creation of the plug 6 because a dopant, which is applied at other angles than vertical to the first main side 20 may also contribute to the implantation. An opening angle α of 0° may ensure that the dopant is only applied at the bottom of the opening.

Figure 12:
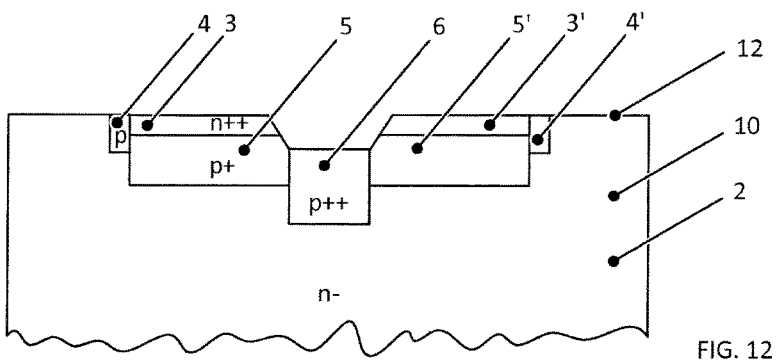
Figure 13:
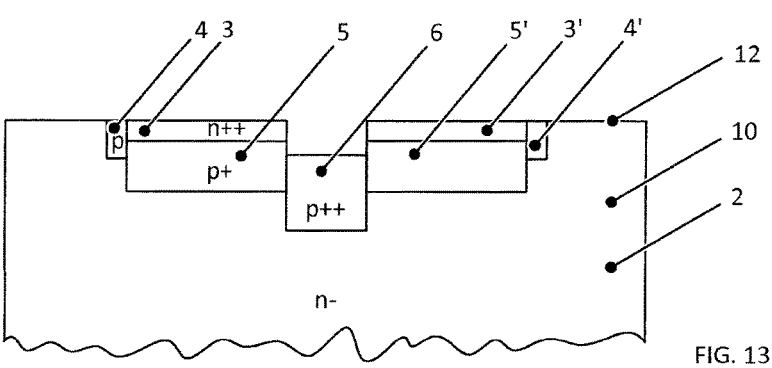
FIG. 13 shows an alternative to the semi-fabricated device of FIG. 12.
Figure 17:
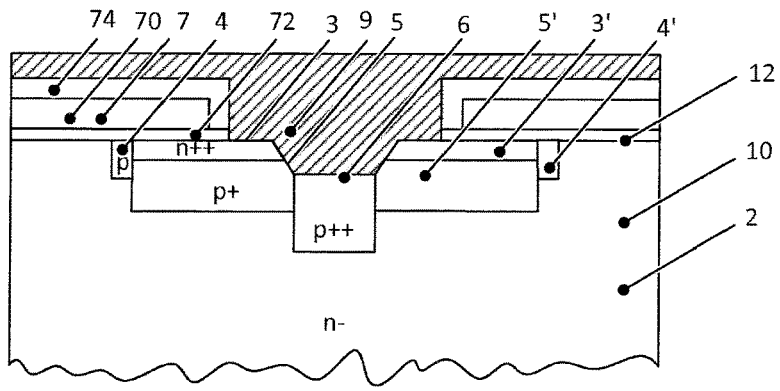

Now the plug mask 62 is removed (FIG. 12). FIG. 12 shows a case, in which the opening angle α is greater than 0° (in the figure about 45°), and FIG. 13 shows the case, in which the opening angle α is 0°. Now gate electrodes 7 are created (FIG. 16) by applying first insulating layer 72, which cover the drift layer 2 at those parts extending to the surface at the first side 12, the channel layers 4, 4' and the outer parts of the source regions 3, 3'. The outer parts shall means those parts of the two source regions 3, 3' not facing each other. An electrically conductive gate layer 70 is applied and on top of it, a second insulating layer 74 is applied which electronically insulates the gate layer 70 from the first main electrode 9. In the opening on top of the source regions 3, 3' not covered by the gate electrodes 7 with the plug 6 and the well layer 5, 5' in between, a first main electrode 9 as ohmic contact in form of an emitter electrode for an IGBT 1 or a source electrode for a MOSFET 1' (metal-oxide semiconductor field-effect transistor) is created. Exemplarily, the first main electrode 9 is created by first applying a metallic layer in the opening to contact the p++ plug 6, the well layers 5, 5' and the source regions 3, 3' and then another metallic layer additionally covering the second insulating layer 74 on top of the gate layer 70 is applied (FIG. 17).

On the second side 14, a second main electrode 90 as ohmic contact in form of a collector electrode for an IGBT 1 or a drain electrode for a MOSFET 1' is created.

In the process, shown in the FIGS. 6 to 10, p+ well layers 5, 5' and source regions 3, 3' are first created in one MOS cell as common, i.e. continuous layers 3, 5, and by the introduction of the p++ plug 6 the well layer 5 and the source region 3 is split into two separate well layers 5, 5' source regions 3, 3' on the lateral sides of the plug 6. Therefore, the term well layer shall also cover two well layers 5, 5', separated from each other by the plug 6 and the term source region shall cover two source regions 3, 3'. Also the channel layer 4, 4' is first created as a common layer, which is then split into two separate channel layers 4, 4' by the introduction of the well layers 5, 5' and/or the source regions 3, 3'.

Figure 18:
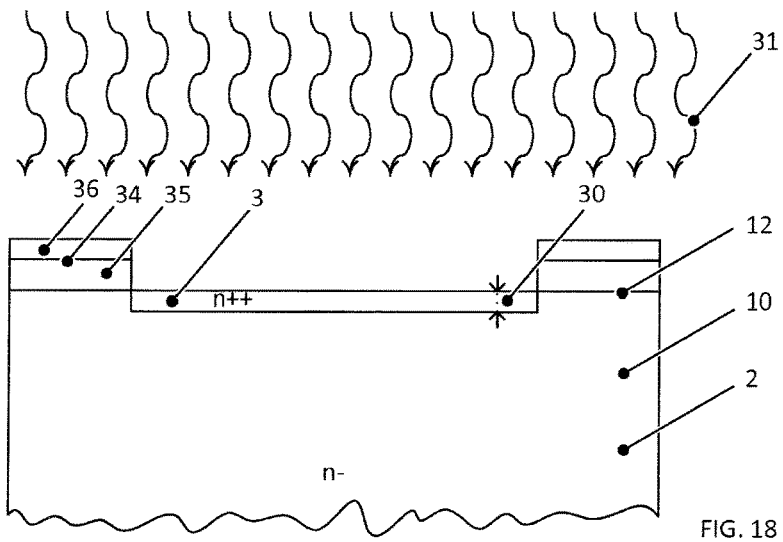
FIGS. 18 to 20 show manufacturing steps of a further alternative manufacturing method (step (b))
Figure 19:
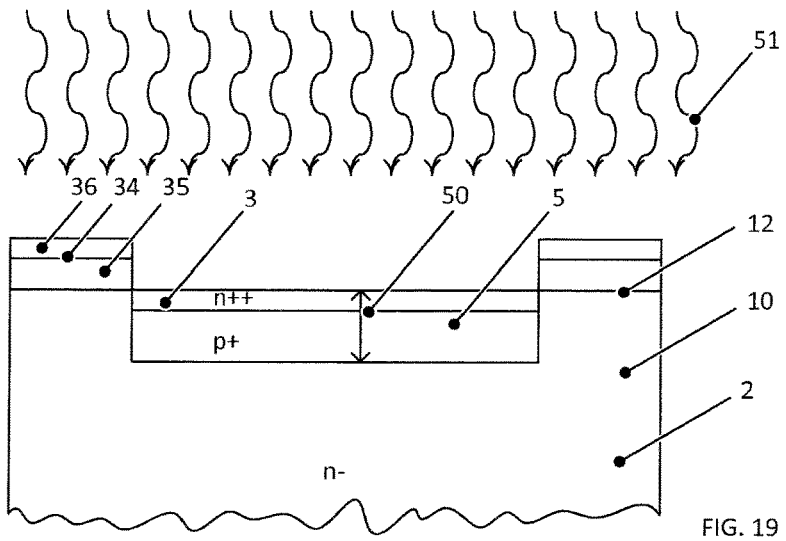
Figure 20:
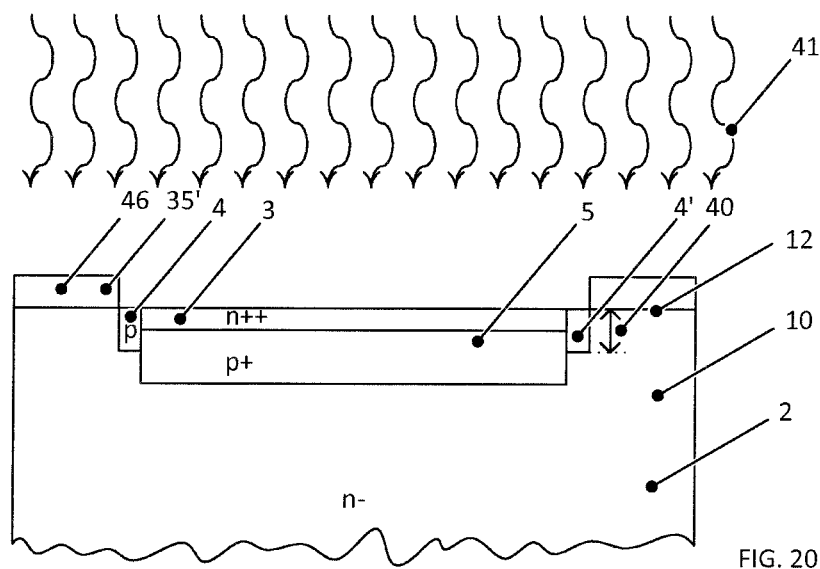
Figure 21:
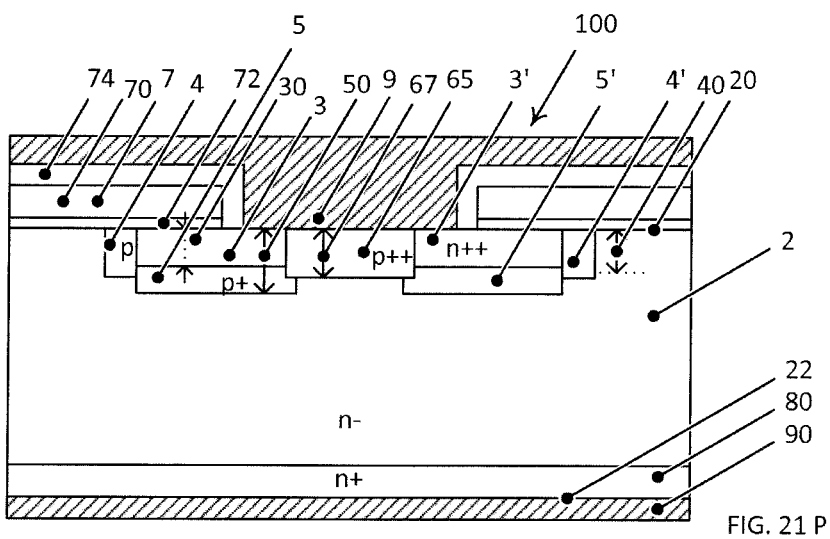
FIG. 21 shows a prior art silicon-carbide MOSFET.
Figure 22:
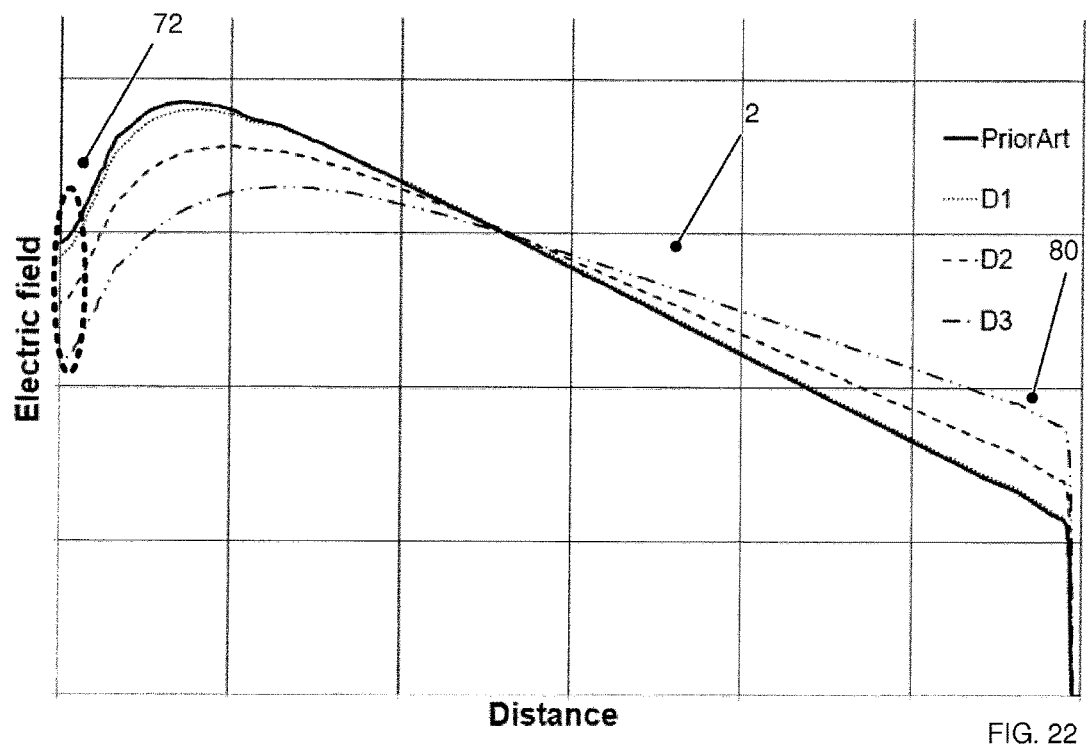
FIGS. 22 to 25 show electric fields along different cuts through the MOS-cell architecture shown exemplary in FIG. 2.
Figure 23:
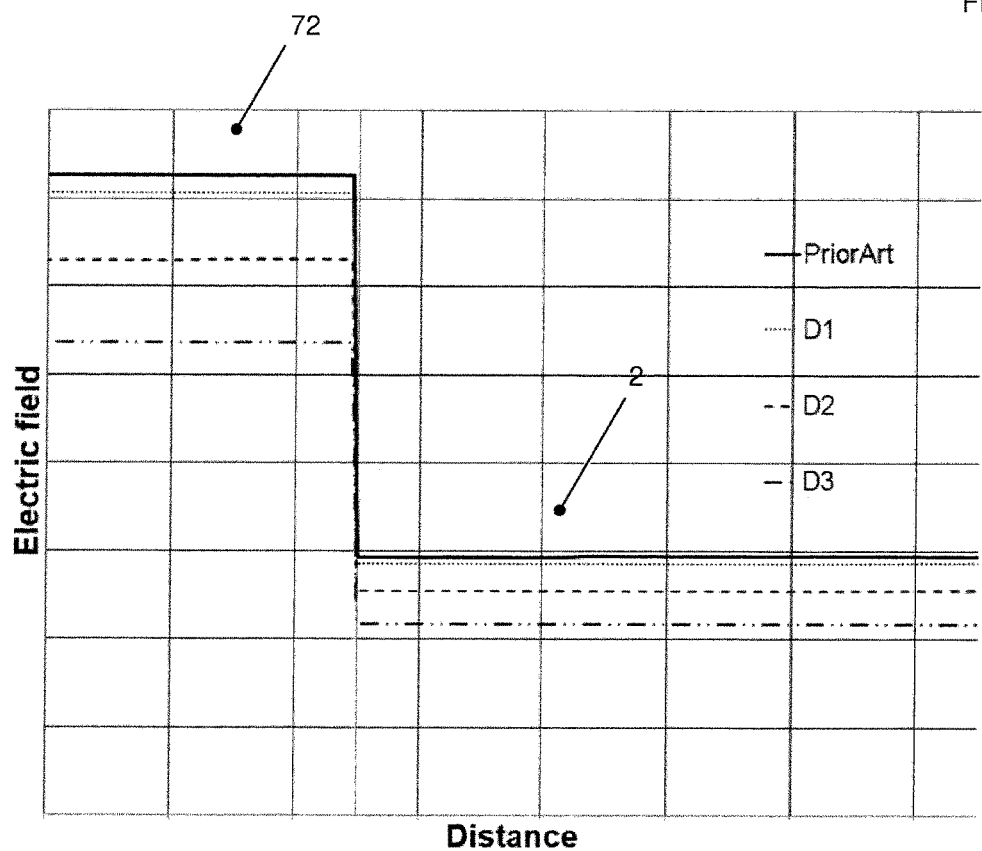
Figure 24:
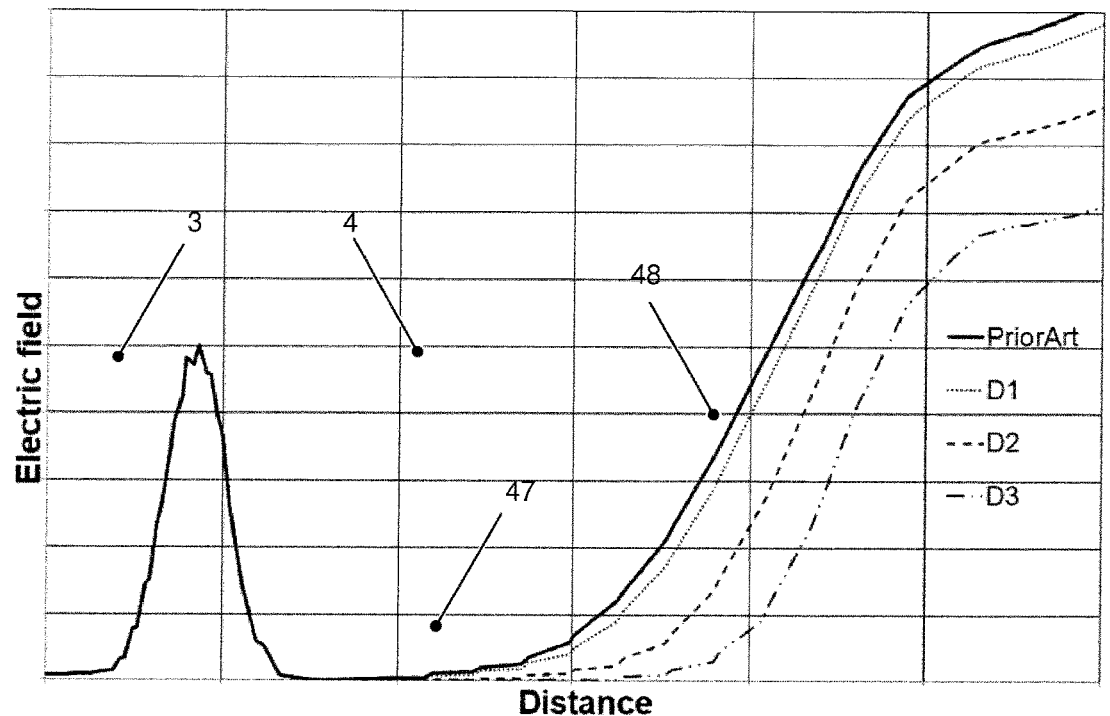
Figure 25:
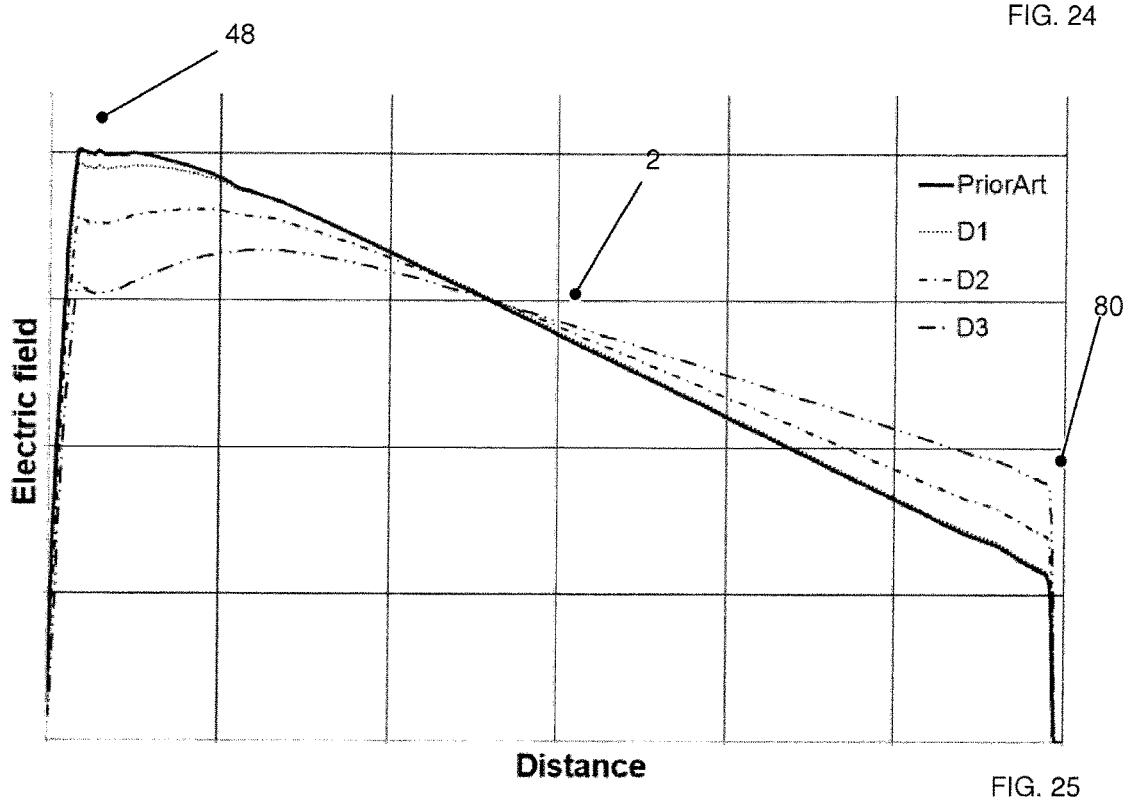
Figure 26:
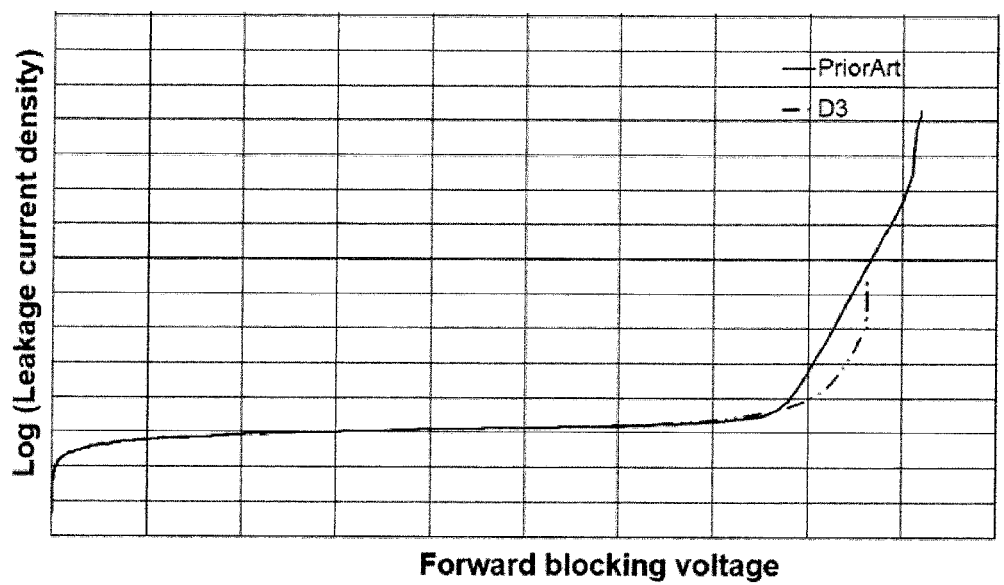
FIG. 26 shows the diminishing of short-channel effects which cause premature breakdown.

In the FIGS. 18 to 20, an alternative manufacturing method for the step (b) is shown. After having provided a lowly doped substrate product 10 (FIG. 3, 4 or 5) in step (a), a first mask layer 35 and on top of it a second mask layer 36 is applied on the first side 12. The first mask layer 35 has a higher etching selectivity than the second mask layer 36, what shall mean that in the following etching process the material of the first mask layer 35 is more sensitive to the etching process than the material of the second mask layer 36. An opening is created through the first and second mask layer 35, 36 down to the substrate product 10 (i.e. to the drift layer 2), thereby creating a third mask 34 (source region mask) on the first side 12. A second dopant 31 (n dopant) is applied for the creation of the source region 3 up to the source region depth 30. All values for the source regions 3, 3', channel layers 4, 4', the well layer 5, 5', and the plug 6 like dose, energy, doping concentrations, dopant type etc. shall have the same exemplary ranges as afore disclosed in the sections about the manufacturing process.

The total mask stack shall have such a thickness that a dopant is hindered from penetration into the substrate product 10 in such areas, which are covered by the mask. The dopants shall penetrate into the substrate product 10 at the positions of the mask openings.

Then a third dopant 51 (p dopant) is applied for the creation of the well layer 5 up to the well layer depth 50.

Now an etching step is performed on the first side 12, by which etching the first mask layer 35 is farther removed at the openings than the second mask layer 36 due to the higher etching selectivity of the first mask layer 35 so that the openings are enlarged in a self-aligned manner. The second mask layer 36 may now be removed, thereby creating a fourth mask 46 (channel layer mask) formed by the remaining first mask layer 35'. Then a first dopant 41 (p dopant) is applied for the creation of the channel layers 4, 4' up to the channel layer depth 40 (FIG. 20).

The following steps for the creation of the plug 6, the gate electrode 7 and the main electrodes 9, 90 are the same as disclosed beforehand.

In the process, shown in the FIGS. 18 to 20, p channel layers 4, 4' are created in one MOS cell as separate regions (channel layers 4, 4' by the region being dominated in the central area by the higher doping concentration of the well layers 5, 5', wherein the source regions 3, 3' and well layers 5, 5' are first created as common layers 3 and 5 (FIGS. 18 and 19) and by the introduction of the p++ plug 6 the source region 3 and well layer 5 is split into two separate source regions 3, 3' and well layers 5, 5' on the lateral sides of the plug 6.

The plug 6 may be created as a retrograde layer having a lower doping concentration in shallow depth and a higher up to a maximum doping concentration in greater depth, which depth may exemplarily be located as deep as the depth of the maximum doping concentration of the well layers 5, 5' or deeper.

The inventive structure and manufacturing method having a deep p++ plug may be applied to different semiconductor devices having MOS cell structures such as MOSFETs and MOS controlled IGBTs.

In another embodiment, the conductivity types of the layers are switched, i.e. all layers of the first conductivity type are p type (e.g. the drift layer 2 and the source regions 3) and all layers of the second conductivity type are n type (e.g. channel layer 4, the well layer 5 and the plug 6).

REFERENCE LIST

1 IGBT
1' MOSFET
10 wide bandgap substrate product
12 first side
14 second side
2 drift layer
20 first main side
22 second main side
25 buffer layer
3, 3' source region
31 second dopant
30 source region depth
32 second mask
34 third mask (source region mask)
35 first mask layer
35' remaining first mask layer
36 second mask layer
4, 4' channel layer
41 first dopant
40 channel layer depth
41 first dopant
42 first mask
44 polycrystalline silicon layer
45 oxide layer
46 fourth mask (channel layer mask)
47 non-depleted region of the channel layer
48 depleted region of the channel layer
49 top mask layer
49' remaining top mask layer
5, 5' well layer
50 well layer depth
51 third dopant
6 plug
60 plug depth
61 fourth dopant
62 plug mask
65 contact layer
67 contact layer depth
7 gate electrode
70 gate layer
72 first insulating layer
74 second insulating layer
8 collector layer
80 drain layer
9 first main electrode
90 second main electrode

The invention claimed is:

1. A method of manufacturing a semiconductor device comprising following manufacturing steps:
(a) providing a wide bandgap substrate product having a lowly doped layer of a first conductivity type forming a drift layer in the semiconductor device, the substrate product having a first side and a second side opposite to the first side, wherein the lowly doped layer is arranged on the first side,
(b) then creating on the first side a source region of the first conductivity type having higher doping concentration than the drift layer up to a source region depth, at least one channel layer of a second conductivity type, which is different from the first conductivity type, having a channel layer depth and surrounding the source region in a lateral direction, which direction is parallel to the first side, thereby separating the source region from the drift layer in the lateral direction, and a well layer of the second conductivity type having a well layer depth, which is at least as large as the channel layer depth, and having a higher doping concentration than the at least one channel layer, wherein the well layer separates the source region from the drift layer on a side of the well layer opposite to the first side, (c) after step (b) applying a continuous mask layer on the first side, then removing material through the continuous mask layer, thereby forming a plug mask having a plug mask opening in the central area of the well layer and source region to a depth, which is at least as deep as the source layer depth and less deep than the well layer depth, thereby splitting the source region into two source regions, applying a dopant of the second conductivity type on the first side such that creating a plug of the second conductivity type in the plug mask opening, the plug extending to a plug depth, which is at least as deep as the well layer depth, and having a higher doping concentration than the well layer, thereby the creation of the plug splitting the well layer into two well layers, (d) after step (c) creating two gate electrodes on the first side, each of which are separated from any doped layer by an insulating layer, (e) after step (c) creating a first main electrode as an ohmic contact on the first side, which contacts the source regions, the well layers and the plug, wherein in step (b) first applying a first mask with an opening for the creation of a channel layer, then applying a first dopant of the second conductivity type for the creation of the channel layer up to the channel layer depth, then applying a further layer on the lateral sides of the first mask, by which further layer the openings are narrowed, thereby forming a second mask, then applying a second dopant of the first conductivity type for the creation of the source region up to the source region depth, then applying a third dopant of the second conductivity type for the creation of the at least one well layer up to the well layer depth.

2. The method of manufacturing the semiconductor device according to claim 1, wherein in step (b)

for forming the first mask forming a continuous stack of layers comprising a polycrystalline silicon layer, removing material from the stack of layers such, that forming the first mask with an opening for the creation of a channel layer, and for forming the second mask forming a further oxide layer, which covers the polycrystalline silicon layer at the top side and lateral sides at the opening such, that forming the second mask having a narrowed opening.

3. The method of manufacturing the semiconductor device according to claim 1, wherein in step (b)

for forming the first mask forming a continuous stack of layers comprising a polycrystalline silicon layer, removing material from the stack of layers such, that forming the first mask with an opening for the creation of a channel layer, and for forming the second mask applying a top mask layer as a continuous layer, performing an etching step without protection mask, by which step removing the top mask layer on top of the first mask and in the opening at the interface to the substrate product, wherein top mask layer material remaining at the lateral sides of the opening, such, that forming the second mask having a narrowed opening.

4. A method of manufacturing a semiconductor device comprising:

(a) providing a wide bandgap substrate product having a lowly doped layer of a first conductivity type forming a drift layer in the semiconductor device, the substrate product having a first side and a second side opposite to the first side, wherein the lowly doped layer is arranged on the first side, (b) then creating on the first side a source region of the first conductivity type having higher doping concentration than the drift layer up to a source region depth, at least one channel layer of a second conductivity type, which is different from the first conductivity type, having a channel layer depth and surrounding the source region in a lateral direction, which direction is parallel to the first side, thereby separating the source region from the drift layer in the lateral direction, and a well layer of the second conductivity type having a well layer depth, which is at least as large as the channel layer depth, and having a higher doping concentration than the at least one channel layer, wherein the well layer separates the source region from the drift layer on a side of the well layer opposite to the first side, (c) after step (b) applying a continuous mask layer on the first side, then removing material through the continuous mask layer, thereby forming a plug mask having a plug mask opening in the central area of the well layer and source region to a depth, which is at least as deep as the source layer depth and less deep than the well layer depth, thereby splitting the source region into two source regions, applying a dopant of the second conductivity type on the first side such that creating a plug of the second conductivity type in the plug mask opening, the plug extending to a plug depth, which is at least as deep as the well layer depth, and having a higher doping concentration than the well layer, thereby by the creation of the plug splitting the well layer into two well layers, (d) after step (c) creating two gate electrodes on the first side, each of which are separated from any doped layer by an insulating layer, (e) after step (c) creating a first main electrode as an ohmic contact on the first side, which contacts the source regions, the well layers and the plug, wherein in step (b) applying a source region mask on the first side having openings for the creation of the source region, which source region mask comprises a first mask layer and a second mask layer on top of the first mask layer, wherein the first mask layer has a higher etching selectivity than the second mask layer, then applying a second dopant of the first conductivity type for the creation of the source region up to the source region depth, then applying a third dopant of the second conductivity type for the creation of the well layer up to the well layer depth, performing an etching step on the first side, by which etching the first mask layer is farther removed at the openings than the second mask layer, removing the second mask layer, wherein the remaining first mask layer forming a channel layer mask, then applying a first dopant of the second conductivity type for the creation of two channel layers up to the channel layer depth.

5. The method of manufacturing the semiconductor device according to claim 1, wherein in step (c) creating the plug with a doping concentration, which is at least 10 times higher than the doping concentration of the at least one well layer.

6. The method of manufacturing the semiconductor device according to claim 1, wherein
creating the plug with a doping concentration, which is between 10 times and 100 times higher than the doping concentration of the at least one well layer.

7. The method of manufacturing the semiconductor device according to claim 1, wherein
in step (c) the plug mask opening has an angle α from a plane perpendicular to the first side between 0° and 60° such that an opening size decreases towards the substrate product.

8. The method of manufacturing the semiconductor device according to claim 1, wherein
in step (b) creating the well layer with a doping concentration, which is at least 10 times higher than the doping concentration of the at least one channel layer.

9. The method of manufacturing the semiconductor device according to claim 1, wherein
in step (b) creating the well layer with a doping concentration which is between 10 times and 100 times higher than the doping concentration of the at least one channel layer.

10. The method of manufacturing the semiconductor device according to claim 1, wherein
in step (b) creating the well layer with a doping concentration between $1*10^{17}$ and $1*10^{21}$ cm$^{-3}$.

11. The method of manufacturing the semiconductor device according to claim 10, wherein
in step (b) creating the well layer with a doping concentration between $1*10^{18}$ and $1*10^{20}$ cm$^{-3}$.

12. The method of manufacturing the semiconductor device according to claim 1, wherein in step (b) creating the at least one channel layer with a doping concentration between $1*10^{16}$ and $1*10^{18}$ cm$^{-3}$.

13. The method of manufacturing the semiconductor device according to claim 1, wherein in step (c) creating the plug with a doping concentration between $2*10^{17}$ and $2*10^{21}$ cm$^{-3}$.

14. The method of manufacturing the semiconductor device according to claim 2, wherein in step (b)
for forming the first mask forming a continuous stack of layers comprising a polycrystalline silicon layer, removing material from the stack of layers such, that forming the first mask with an opening for the creation of a channel layer, and
for forming the second mask applying a top mask layer as a continuous layer, performing an etching step without protection mask, by which step removing the top mask layer on top of the first mask and in the opening at the interface to the substrate product, wherein top mask layer material remaining at the lateral sides of the opening, such, that forming the second mask having a narrowed opening.

15. The method of manufacturing the semiconductor device according to claim 2, wherein step (c) creating the plug with a doping concentration, which is at least 10 times higher than the doping concentration of the at least one well layer.

16. The method of manufacturing the semiconductor device according to claim 3, wherein in step (c) creating the plug with a doping concentration, which is at least 10 times higher than the doping concentration of the at least one well layer.

17. The method of manufacturing the semiconductor device according to claim 4, wherein in step (c) creating the plug with a doping concentration, which is at least 10 times higher than the doping concentration of the at least one well layer.

18. The method of manufacturing the semiconductor device according to claim 2, wherein in said creating the plug with a doping concentration, which is between 10 times and 100 times higher than the doping concentration of the at least one well layer.

19. The method of manufacturing the semiconductor device according to claim 3, wherein in said creating the plug with a doping concentration, which is between 10 times and 100 times higher than the doping concentration of the at least one well layer.

20. The method of manufacturing the semiconductor device according to claim 4, wherein in said creating the plug with a doping concentration, which is between 10 times and 100 times higher than the doping concentration of the at least one well layer.

* * * * *